(12) United States Patent
Lee et al.

(10) Patent No.: US 10,770,337 B2
(45) Date of Patent: Sep. 8, 2020

(54) LIFT PIN ASSEMBLY, SUBSTRATE SUPPORT APPARATUS AND SUBSTRATE PROCESSING APPARATUS HAVING THE SAME

(71) Applicant: Samsung Electronics Co., Ltd., Suwon-si, Gyeonggi-do (KR)

(72) Inventors: Ja-Woo Lee, Hwaseong-si (KR); Seung-Won Shin, Gangdong-gu (KR); Su-Ho Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 220 days.

(21) Appl. No.: 15/944,909

(22) Filed: Apr. 4, 2018

(65) Prior Publication Data

US 2019/0080955 A1 Mar. 14, 2019

(30) Foreign Application Priority Data

Sep. 12, 2017 (KR) .................... 10-2017-0116812

(51) Int. Cl.
| | |
|---|---|
| B23P 19/04 | (2006.01) |
| H01L 21/687 | (2006.01) |
| H01L 21/67 | (2006.01) |
| H01L 21/683 | (2006.01) |
| G03F 7/20 | (2006.01) |
| H01J 37/32 | (2006.01) |

(52) U.S. Cl.
CPC ........ *H01L 21/68742* (2013.01); *G03F 7/707* (2013.01); *G03F 7/70691* (2013.01); *G03F 7/70758* (2013.01); *H01J 37/32715* (2013.01); *H01J 37/32733* (2013.01); *H01L 21/67069* (2013.01); *H01L 21/6833* (2013.01)

(58) Field of Classification Search
USPC ...................... 29/244, 249, 255; 269/13, 296
See application file for complete search history.

(56) References Cited

U.S. PATENT DOCUMENTS

| 5,834,737 A | 11/1998 | Hirose et al. |
|---|---|---|
| 9,011,602 B2 | 4/2015 | Hao |
| | (Continued) | |

FOREIGN PATENT DOCUMENTS

| KR | 10-2005-0070772 A | 7/2006 |
|---|---|---|
| KR | 10-0709713 B1 | 4/2007 |
| | (Continued) | |

*Primary Examiner* — Joseph J Hail
*Assistant Examiner* — Shantese L McDonald
(74) *Attorney, Agent, or Firm* — Sughrue Mion, PLLC

(57) ABSTRACT

A lift pin assembly includes a lift pin having a first longitudinal axis substantially parallel with a first direction, a pin connection block combined with a lower end portion of the lift pin and including a first guide recess in a lower end portion of the pin connection block, the first guide recess extending in a second direction substantially perpendicular to the first direction, and a lift pin holder having a second longitudinal axis substantially parallel with the first direction and including a first sliding portion to be received movably in the second direction within the first guide recess by an eccentricity distance of the second longitudinal axis from the first longitudinal axis when the lift pin holder is connected to the lower end portion of the pin connection block.

20 Claims, 14 Drawing Sheets

(56) References Cited

U.S. PATENT DOCUMENTS

| | | | | |
|---|---|---|---|---|
| 2003/0205329 | A1* | 11/2003 | Gujer | C23C 16/405 |
| | | | | 156/345.51 |
| 2006/0156981 | A1* | 7/2006 | Fondurulia | C23C 16/4583 |
| | | | | 118/715 |
| 2011/0315080 | A1 | 12/2011 | Choi et al. | |
| 2015/0348823 | A1* | 12/2015 | Chia | H01L 21/68742 |
| | | | | 269/296 |
| 2017/0076915 | A1* | 3/2017 | Boyd, Jr. | H01J 37/32715 |
| 2017/0133260 | A1* | 5/2017 | Pohl | H01L 21/68742 |

FOREIGN PATENT DOCUMENTS

| | | |
|---|---|---|
| KR | 10-0808374 B1 | 2/2008 |
| KR | 10-0968814 B1 | 7/2010 |
| KR | 10-2010-0100269 A | 9/2010 |
| KR | 10-0989852 B1 | 10/2010 |
| KR | 10-2013-0015614 A | 2/2013 |
| KR | 10-1281403 B1 | 6/2013 |
| KR | 10-1537675 B1 | 7/2015 |
| KR | 10-2015-0120750 A | 10/2015 |
| KR | 10-2006-0082091 A | 7/2016 |
| KR | 10-1638497 B1 | 7/2016 |

\* cited by examiner

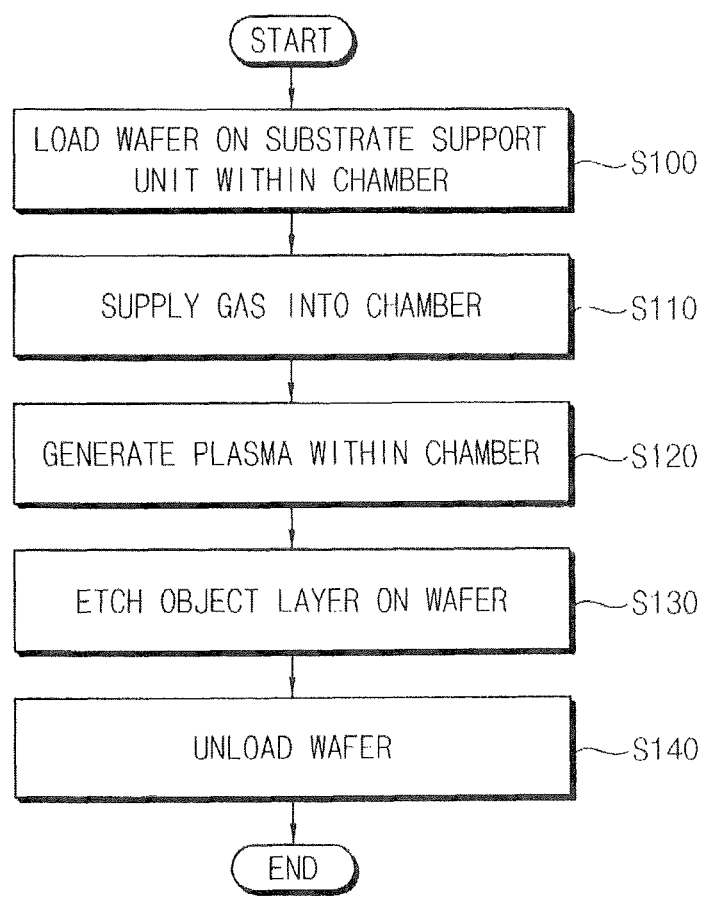

LIFT PIN ASSEMBLY, SUBSTRATE SUPPORT APPARATUS AND SUBSTRATE PROCESSING APPARATUS HAVING THE SAME

REFERENCE TO RELATED APPLICATION

This application claims priority under 35 U.S.C. § 119 to Korean Patent Application No. 10-2017-0116812, filed on Sep. 12, 2017 in the Korean Intellectual Property Office (KIPO), the contents of which are herein incorporated by reference in their entirety.

FIELD

Example embodiments relate to a lift pin assembly, a substrate support unit having the same and a substrate processing apparatus having the same. More particularly, example embodiments relate to a lift pin assembly having a lift pin installed in an electrostatic chuck to be movable upwardly and downwardly, a substrate support unit having the same and a substrate processing apparatus having the same.

BACKGROUND

Generally, a substrate processing apparatus which is used for performing semiconductor unit processes for manufacturing of semiconductor devices may include a substrate plate within a chamber, on which a substrate is seated. A plurality of lift pins for lifting the substrate may be installed in the substrate plate to be spaced apart from each other. However, when an upper part and a lower part of the substrate plate become misaligned as a result of parallelism discrepancy due to machining and assembly tolerances for the lift pin hole of the substrate plate, lift pin driving plate, etc., and distortion due to vacuum formation, etc., particles may be generated by tilting of the lift pin, and interference between the lift pin and the substrate plate may lead to the lift pin being broken by stress concentration.

SUMMARY

Example embodiments provide a lift pin assembly capable of preventing tilting of a lift pin.

Example embodiments provide a substrate support unit having the above-mentioned lift pin assembly.

Example embodiments provide a substrate processing apparatus having the above-mentioned substrate support unit.

According to example embodiments, a lift pin assembly includes a lift pin having a first longitudinal axis substantially parallel with a first direction, a pin connection block combined with a lower end portion of the lift pin, the pin connection block including a first guide recess in a lower end portion of the pin connection block, the first guide recess extending in a second direction substantially perpendicular to the first direction, and a lift pin holder having a second longitudinal axis substantially parallel with the first direction, the lift pin holder including a first sliding portion to be received movably in the second direction within the first guide recess by an eccentricity distance of the second longitudinal axis from the first longitudinal axis when the lift pin holder is connected to the lower end portion of the pin connection block.

According to example embodiments, a lift pin assembly includes a lift pin having a first longitudinal axis substantially parallel with a first direction, a pin connection block combined with a lower end portion of the lift pin, the lift pin connection block including a first guide recess and a second guide recess in a lower end portion of the pin connection block, the first guide recess and the second guide recess in communication with each other and extending in a second direction substantially perpendicular to the first direction respectively, and a lift pin holder having a second longitudinal axis substantially parallel with the first direction, the lift pin holder including a first sliding portion to be received movably in the second direction within the first guide recess by an eccentricity distance of the second longitudinal axis from the first longitudinal axis when the lift pin holder is connected to the lower end portion of the pin connection block and a second sliding portion to be received movably in the second direction within the second guide recess while a movement of the second sliding portion in the first direction is limited.

According to example embodiments, a lift pin assembly includes a lift pin having a first longitudinal axis, a lift pin holder having a second longitudinal axis, and a pin connection block combined with a lower end portion of the lift pin and connected to an upper end portion of the lift pin holder such that the lift pin is movable in a horizontal direction with respect to the lift pin holder by an eccentricity distance of the first longitudinal axis from the second longitudinal axis.

According to example embodiments, a substrate support unit includes a substrate plate on which a substrate is seated, and at least one lift pin assembly. The lift pin assembly includes a lift pin having a first longitudinal axis, wherein the lift pin is movable upwardly and downwardly in the substrate plate to support the substrate; a pin connection block combined with a lower end portion of the lift pin, the pin connection block including a first guide recess and a second guide recess in a lower end portion of the pin connection block, wherein the first guide recess and the second guide recess are in communication with each other and extend in a horizontal direction substantially perpendicular to an extending direction of the pin connection block respectively, and a lift pin holder having a second longitudinal axis, the lift pin holder including a first sliding portion to be received movably in the horizontal direction within the first guide recess by an eccentricity distance of the first longitudinal axis from the second longitudinal axis when the lift pin holder is connected to the lower end portion of the pin connection block and a second sliding portion to be received movably in the horizontal direction within the second guide recess while a movement of the second sliding portion in the extending direction of the pin connection block is limited.

According to example embodiments, a substrate processing apparatus include a chamber providing a space for processing a substrate, a substrate plate within the chamber and on which a substrate is seated, and at least one lift pin assembly. The lift pin assembly includes a lift pin having a first longitudinal axis, wherein the lift pin is movable upwardly and downwardly in the substrate plate to support the substrate, a pin connection block combined with a lower end portion of the lift pin, the pin connection block including a first guide recess and a second guide recess in a lower end portion of the pin connection block, wherein the first guide recess and the second guide recess are in communication with each other and extend in a horizontal direction substantially perpendicular to an extending direction of the pin connection block respectively, and a lift pin holder having a second longitudinal axis, the lift pin holder including a first sliding portion to be received movably in the horizontal direction within the first guide recess by an eccentricity distance of the first longitudinal axis from the second longitudinal axis when the lift pin holder is connected to the lower end portion of the pin connection block and a second sliding portion to be received movably in the horizontal direction within the second guide recess while a movement of the second sliding portion in the extending direction of the pin connection block is limited.

According to example embodiments, a lift pin assembly may include a pin connection block connecting a lift pin and a lift pin holder while allowing a relative movement in a horizontal direction by an eccentricity distance between the lift pin and the lift pin holder.

Accordingly, even though misalignment between an upper part and a lower part of an electrostatic chuck occurs, the pin connection block may perform a self-aligning function to correct central axes of the lift pin and the lift pin holder, thereby enabling the lift pin to move upward and downward in a vertical direction without tilting.

Further, since a relative movement in the vertical direction between the pin connection block and the lift pin holder is limited, the lift pin combined with the pin connection block may be limited so as not to shake up and down in the vertical direction, to thereby prevent wafer sticking.

BRIEF DESCRIPTION OF THE DRAWINGS

Example embodiments will be more clearly understood from the following detailed description taken in conjunction with the accompanying drawings. FIGS. 1 to 15 represent non-limiting, example embodiments as described herein.

FIG. 1 is a cross-sectional view illustrating a substrate processing apparatus in accordance with example embodiments.

FIG. 2 is a perspective view illustrating a lift pin assembled into a substrate plate in FIG. 1.

FIG. 3 is a cross-sectional view illustrating a lift pin assembly installed in the substrate plate in FIG. 1.

FIG. 4 is a perspective view illustrating the lift pin assembly in FIG. 3.

FIG. 5 is an exploded perspective view illustrating the lift pin assembly in FIG. 4.

FIG. 6 is a perspective view illustrating a pin connection block connecting a lift pin and a lift pin holder of the lift pin assembly in FIG. 4.

FIG. 7 is a cross-sectional view illustrating the lift pin assembly in FIG. 6.

FIG. 8 is a perspective view illustrating the pin connection block of the lift pin assembly in FIG. 4.

FIG. 9 is a cross-sectional view taken along the line A-A' in FIG. 7.

FIG. 10 is a cross-sectional view taken along the line B-B' in FIG. 7.

FIG. 11 is a cross-sectional view illustrating alignment of the lift pin with the pin connection block before being assembled with each other.

FIG. 12 is a cross-sectional view illustrating the lift pin after being assembled with the pin connection block in FIG. 11.

FIG. 13 is a cross-sectional view taken along the line C-C' in FIG. 12.

FIG. 14 is a cross-sectional view illustrating the state of the lift pin in FIG. 12 when the lift pin is moved upwardly.

FIG. 15 is a flow chart illustrating a substrate processing method in accordance with example embodiments.

DETAILED DESCRIPTION OF EXAMPLE EMBODIMENTS

Hereinafter, example embodiments will be explained in detail with reference to the accompanying drawings.

Figure 1:
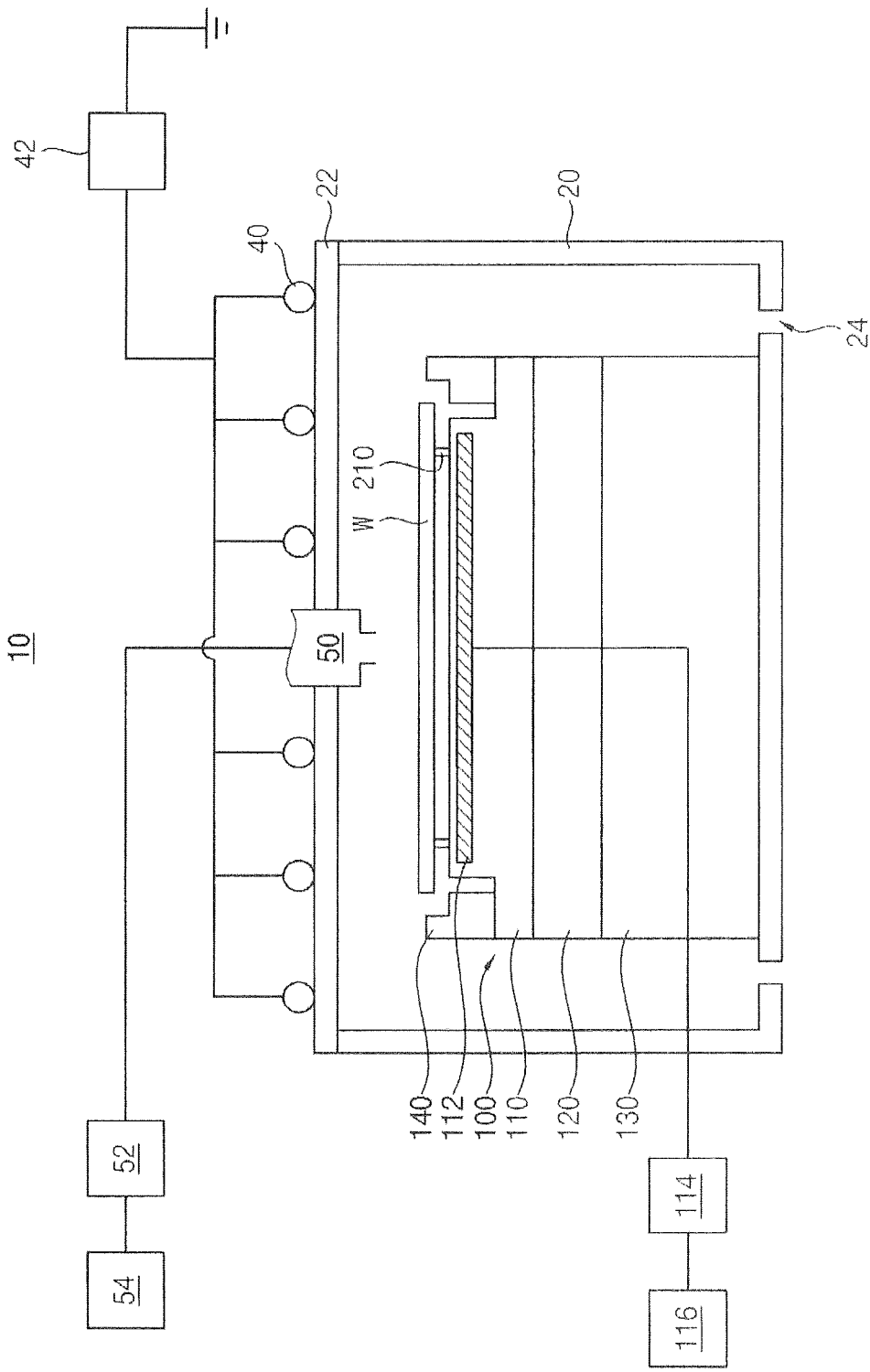
Figure 2:
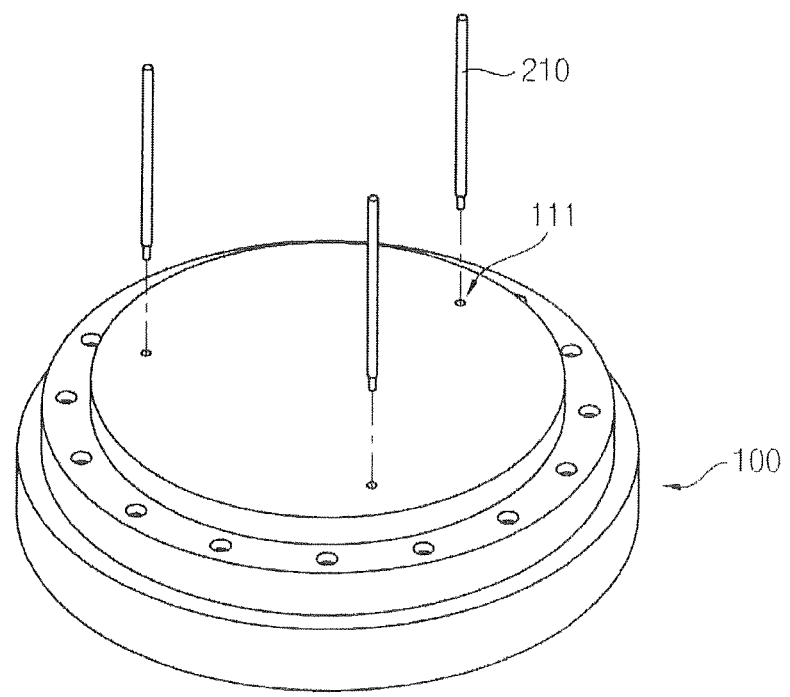
Figure 3:
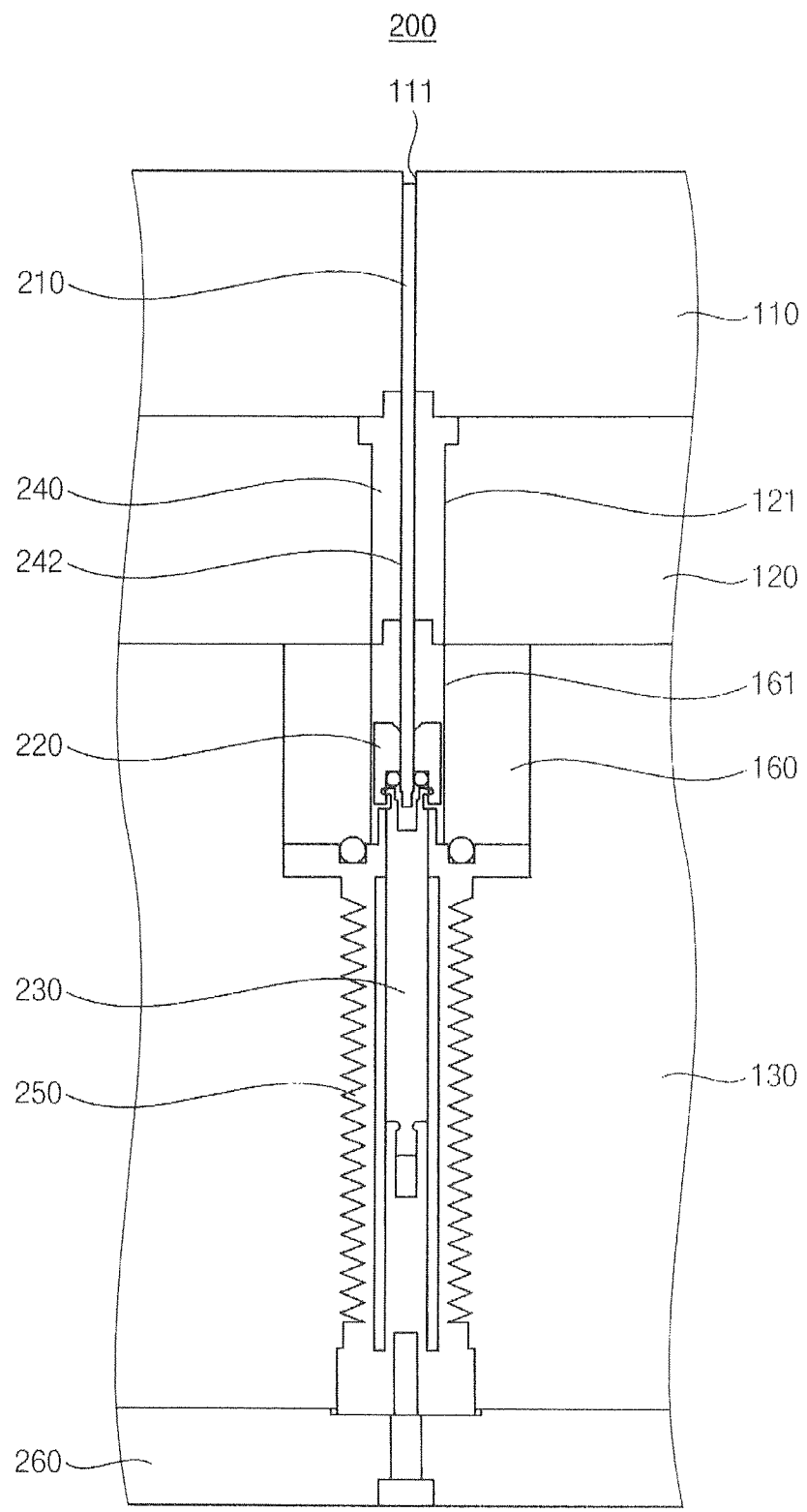
Figure 4:
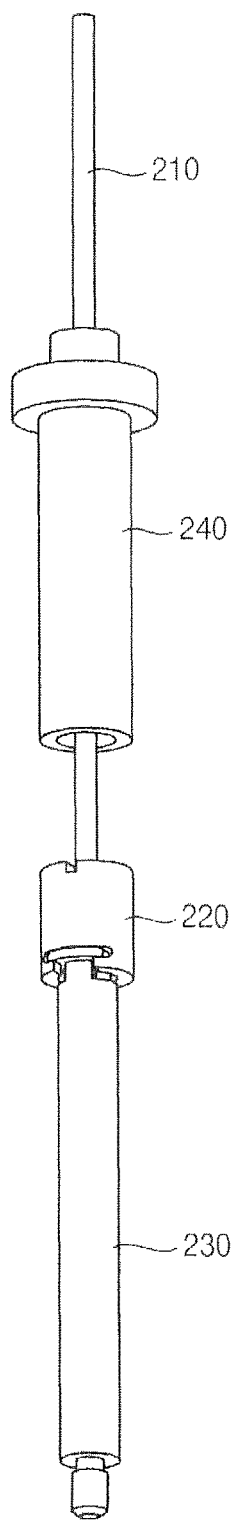
Figure 5:
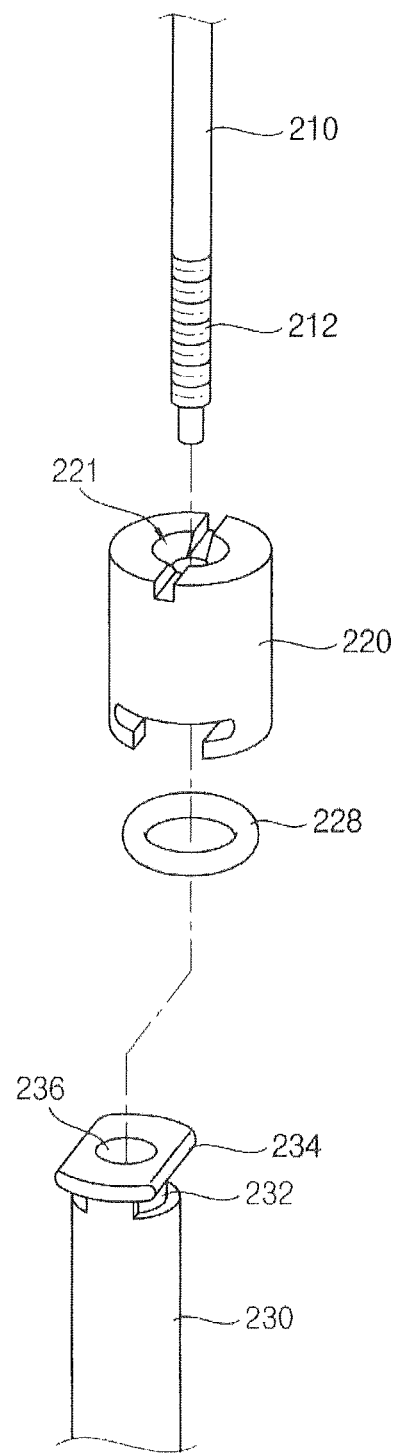
Figure 6:
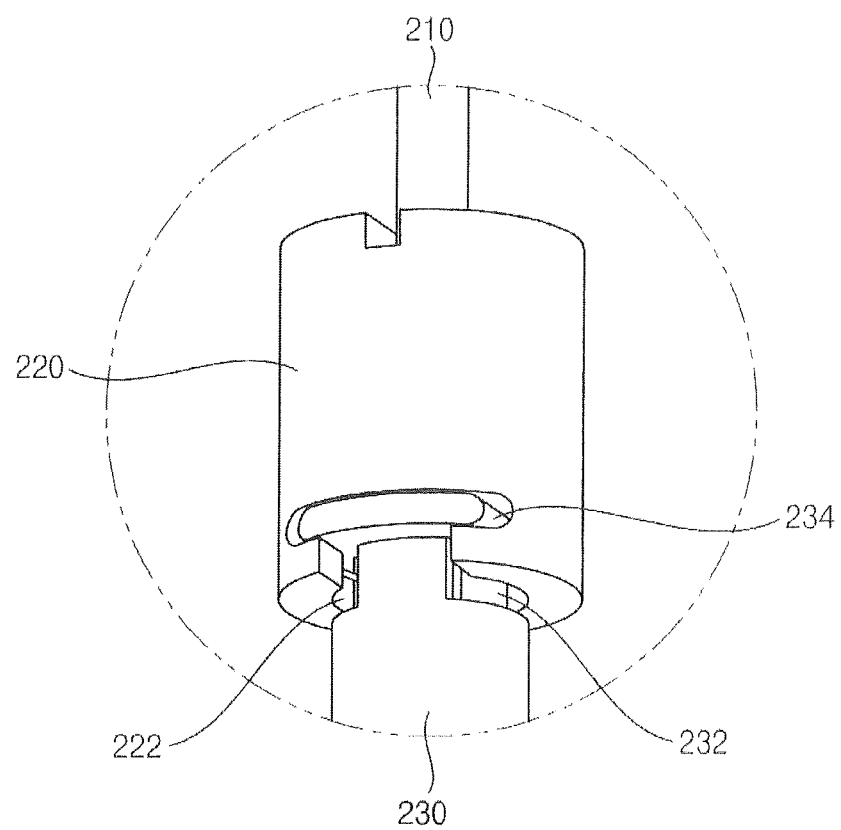
Figure 7:
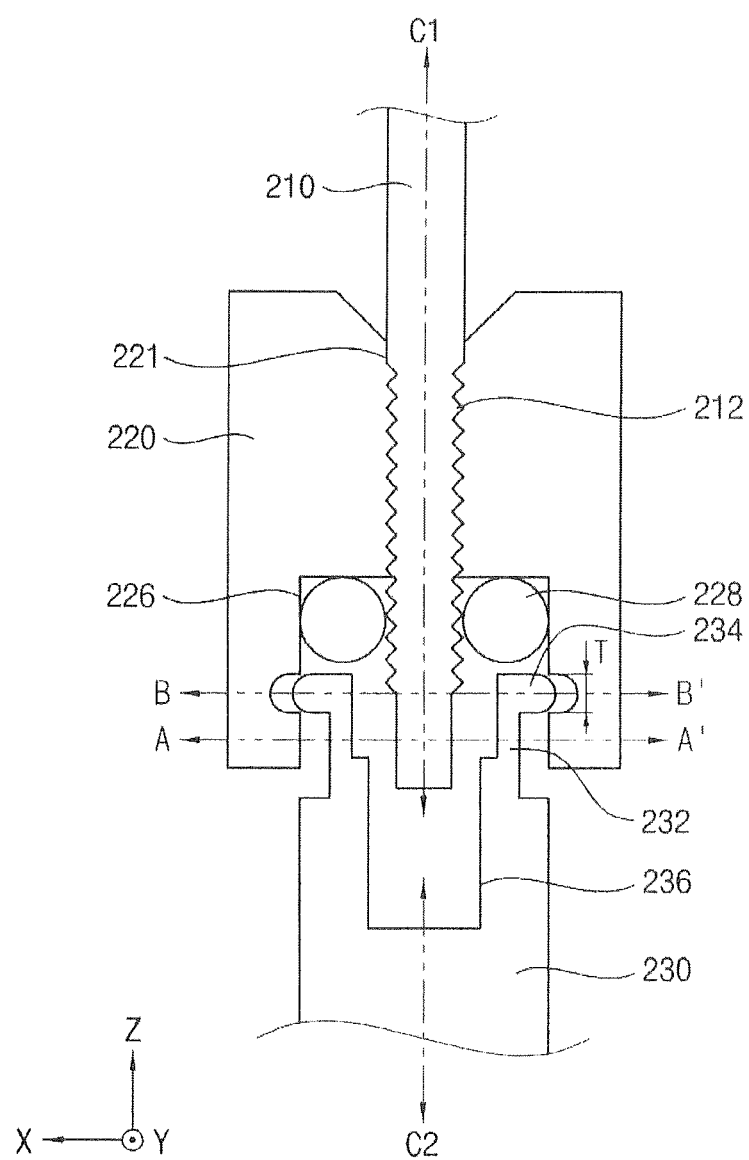
Figure 8:
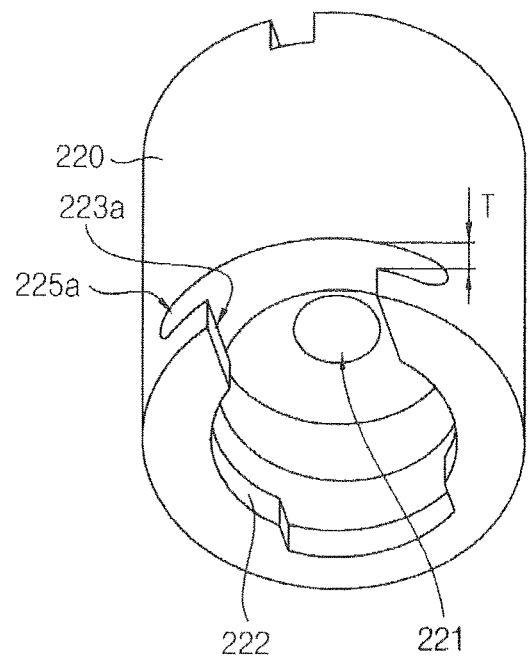
Figure 9:
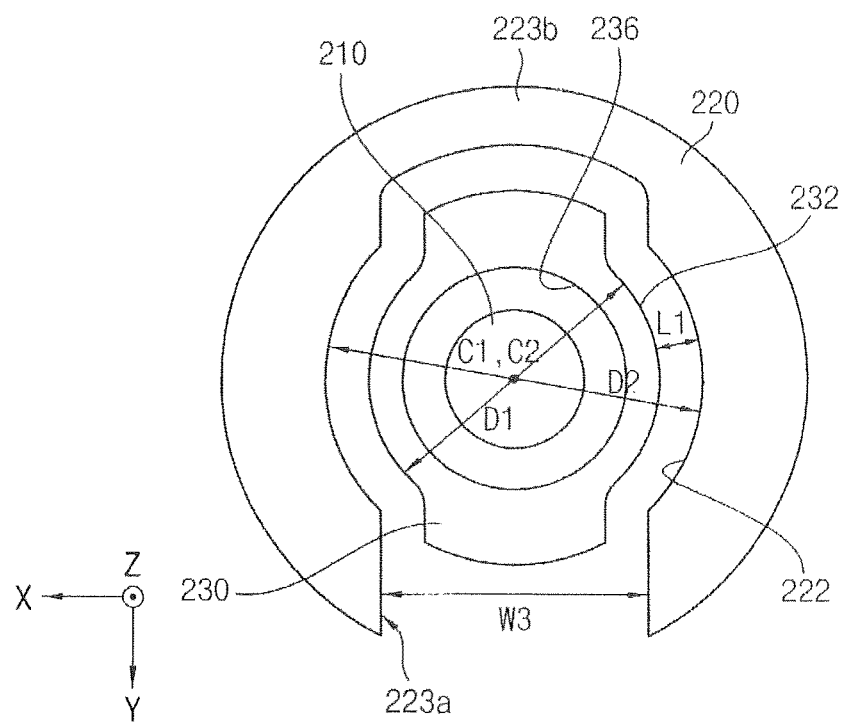
Figure 10:
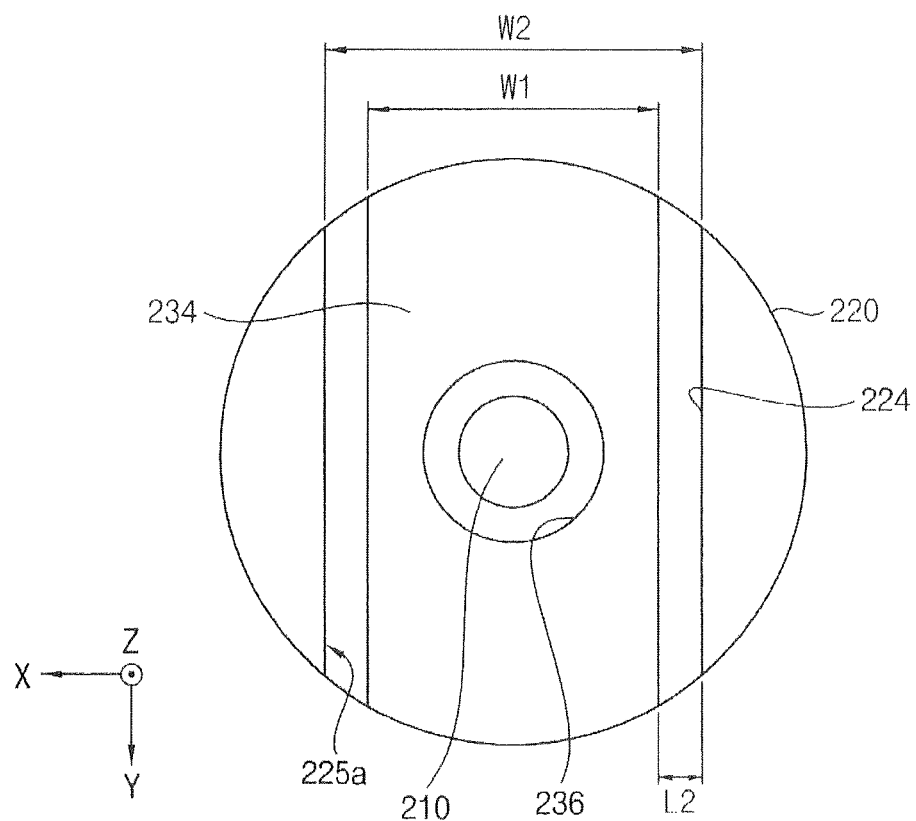

FIG. 1 is a cross-sectional view illustrating a substrate processing apparatus in accordance with example embodiments. FIG. 2 is a perspective view illustrating a lift pin assembled into a substrate plate in FIG. 1. FIG. 3 is a cross-sectional view illustrating a lift pin assembly installed in the substrate plate in FIG. 1. FIG. 4 is a perspective view illustrating the lift pin assembly in FIG. 3. FIG. 5 is an exploded perspective view illustrating the lift pin assembly in FIG. 4. FIG. 6 is a perspective view illustrating a pin connection block connecting a lift pin and a lift pin holder of the lift pin assembly in FIG. 4. FIG. 7 is a cross-sectional view illustrating the lift pin assembly in FIG. 6. FIG. 8 is a perspective view illustrating the pin connection block of the lift pin assembly in FIG. 4. FIG. 9 is a cross-sectional view taken along the line A-A' in FIG. 7. FIG. 10 is a cross-sectional view taken along the line B-B' in FIG. 7.

Referring to FIGS. 1 to 3, a substrate processing apparatus 10 may include a chamber 20 configured to provide a space for processing a substrate such as wafer W and a substrate support unit 100 within the chamber 20 and configured to support the substrate. The substrate support unit 100 may include a substrate plate on which the substrate is loaded and at least one lift pin assembly 200 having a lift pin 210 which is installed movable upwardly and downwardly within the substrate plate to support the substrate. In addition, the substrate processing apparatus 10 may further include a plasma power supply, a bias power supply, a gas supply and an exhaust portion.

In example embodiments, the substrate processing apparatus 10 may be a plasma processing apparatus which etches the substrate using plasma. For example, the substrate processing apparatus 10 may be an apparatus which etches a layer on a substrate such as wafer W disposed within the chamber 20, with, for example, an inductively coupled plasma (ICP), generated within the chamber 20. However, the plasma generated by the substrate processing apparatus is not particularly limited to inductively coupled plasma. For example, capacitively coupled plasma, microwave plasma, etc., may be generated by the substrate processing apparatus. Additionally, the substrate processing apparatus is not particularly limited to an etching apparatus. For example, the substrate processing apparatus may be used as a deposition apparatus, a cleaning apparatus, etc. Substrates processed by the substrate processing apparatus 10 include, but are not particularly limited to, a semiconductor substrate, a glass substrate, etc.

The chamber 20 may provide a sealed space where a plasma etching process is performed on the wafer W. The chamber 20 may include a metal such as aluminum, stainless steel, etc. The chamber 20 may include a cover 22 covering an upper portion of the chamber 20. The cover 22 may form an airtight seal with the upper portion of the chamber 20. The cover 22 may include a dielectric window.

In example embodiments, the substrate support unit 100 may be installed within the chamber 20 to support the wafer W. The substrate support unit 100 may be provided as an electrostatic chuck for holding the substrate W using electrostatic force. The substrate support unit 100 may include a substrate plate 110 (that is, a substrate support plate), an insulation plate 120, a lower cover 130 and a focus ring 140.

The substrate plate 110 may be positioned in an upper portion of the substrate support unit 100. The substrate plate 110 may include an electrostatic electrode 112 therein. The electrostatic electrode 112 may be electrically connected to a DC power source 116 via an ON-OFF switch 114. When the ON-OFF switch 114 is turned ON, the electrostatic electrode 112 may apply an electrostatic force on the wafer W on the substrate plate 110, and thus, the wafer W may be held on the substrate plate 110 by the electrostatic force.

The insulation plate 120 may be disposed between the substrate plate 110 and the lower cover 130 to electrically insulate between the substrate plate 110 and the lower cover 130.

The lower cover 130 may be positioned in a lower portion of the substrate support unit 100. The lower cover 130 may have a space therein, of which an upper end opens. The upper end of the lower cover 130 may be covered by the insulation plate 120. A driving mechanism including a lift pin driving plate 260 for moving the lift pin 210 upward and downward may be disposed in the space of the lower cover 130.

The focus ring 140 may have a ring shape to surround the wafer W.

Although it is not illustrated in the figures, a heater and a plurality of pathways may be formed in the substrate plate 110. The heater may be electrically connected to a power source to heat the wafer W through the substrate plate 110. The heater may include a spiral coil. The pathway may be used as a channel through which a heat transfer fluid circulates. The pathway may be formed in the substrate plate to have a spiral shape.

In example embodiments, the plasma power supply may include a source RF power source 42 to apply a plasma source power output to an upper electrode 40. The source RF power source 42 may generate a radio frequency (RF) signal. The upper electrode 40 may include a coil having a spiral shape or a concentric shape. The bias power supply may include a bias RF power source to apply a bias source power output to a lower electrode (not illustrated) in the substrate support unit 100.

The gas supply may include a gas supply line 50, a flow controller 52 and a gas supply source 54. The gas supply may supply different gasses into the chamber 20.

When a radio frequency power output having a predetermined frequency (for example, 13.56 MHz) is applied to the upper electrode 40, an electromagnetic field induced by the upper electrode 40 may be applied to a source gas supplied within the chamber 20 to generate plasma. When the bias power is applied to the lower electrode, the substrate plate 110 may attract plasma atoms or ion generated within the chamber 20.

The exhaust portion may include an exhaust line connected to an exhaust port 24 formed in a bottom of the chamber 20. Process by-products and residual process gases may be discharged through the exhaust line. The processing space inside the chamber 20 may be depressurized to a desired vacuum level by the exhaust portion.

In example embodiments, the lift pin 210 may receive the wafer W transferred into the processing space within the chamber 20 by a transfer mechanism and move to the substrate plate 110. The lift pin 210 may seat the wafer W on the substrate plate 110 or lift the wafer W from the substrate plate 110. For example, a plurality of the lift pins 210 may be provided. The lift pin 210 may be installed to be movable upwardly and downwardly within a lift pin hole 111 which penetrates through the substrate plate 110.

Hereinafter, the lift pin assembly will be explained with reference to FIGS. 3 to 10.

Referring to FIGS. 3 to 10, the lift pin assembly 200 may include a lift pin 210, a pin connection block 220 and a lift pin holder 230. In addition, the lift pin assembly 200 may further include a lift pin guide 240, bellows 250 and lift pin driving plate 260.

The lift pin assembly 200 may be mounted in a mounting hole of the substrate support unit 100. The mounting hole may include the lift pin hole 111 of the substrate plate 110 and a pin guide receiving hole 121 which penetrates through the insulation plate 120. The lift pin hole 111 may be operable to pass the lift pin 210, and the pin guide receiving hole 121 may be designed such that the lift pin guide 240 is received fixedly in the pin guide receiving hole 121. A pin guide hole 242 may be formed to penetrate through the lift pin guide 240 and may be connected to the lift pin hole 111. The insulation plate 120 may retain the lift pin assembly 200 within the mounting hole. Inner diameter tolerances of the pin guide hole 242 may be designed precisely in consideration of outer diameter tolerances of the lift pin 210, to limit lateral movement of the lift pin 210.

A fastening block 160 may be installed fixedly under the insulation plate 120, and a block receiving hole 161 may penetrate through the fastening block 160 to be connected to the pin guide receiving hole 121. The pin connection block 220 may be received movably upwardly and downwardly within the block receiving hole 161.

The bellows 250 may surround the lift pin holder 230 connected to the pin connection block 220 to separate the inner space of the chamber 20 and the inner space of the lower cover 130. An upper end portion of the bellows 250 may be connected to a lower surface of the fastening block 160, and a lower end portion of the bellows 250 may be connected to the lift pin driving plate 260.

In example embodiments, the lift pin 210 and the lift pin holder 230 may be connected to each other by the pin connection block 220. The pin connection block 220 may be combined with a lower end portion 212 of the lift pin 210, and the lift pin holder 230 may be connected to a lower portion of the pin connection block 220. The pin connection block 220 may be connected to the lift pin holder 230 such that the pin connection block 220 is movable within a predetermined distance in a horizontal direction with respect to the lift pin holder 230. In addition, the pin connection block 220 may be connected to the lift pin holder 230 such that a relative movement in a vertical direction of the lift pin holder 230 with respect to the lift pin holder 230 is limited.

In particular, a fastening hole 221 may be formed in the pin connection block 220 to receive the lower end portion 212 of the lift pin 210. Threads may be formed on an outer surface of the lower end portion 212 of the lift pin 210 and an inner surface of the fastening hole 221 respectively, and thus, the lift pin 210 may be connected threadedly with the pin connection block 220. Accordingly, a height of the lift pin 210 may be adjusted minutely.

The fastening hole 221 may extend along a central axis of the pin connection block 220. Accordingly, the central axis of the pin connection block 220 may coincide with a longitudinal axis C1 of the lift pin 210. The lift pin 210 and the pin connection block 220 may extend in the same direction.

In example embodiments, the lift pin assembly 200 may further include a securing ring 228 for combining with the lower end portion of the lift pin 210 which penetrates through and protrudes from the fastening hole 221 of the pin connection block 220.

A ring receiving recess 226 for receiving the securing ring 228 may be further formed in the lower portion of the pin connection block 220 to be connected to the fastening hole 221. The securing ring 228 may include an O-ring mounted in the ring receiving recess 226. Accordingly, the securing ring 228 may prevent a screw loosening of the lift pin 210.

A recess for receiving an upper end portion of the lift pin holder 230 may be formed in a lower end portion of the pin connection block 220. In particular, a first guide recess 222 may be formed in the lower end portion of the pin connection block 220. The first guide recess 222 may extend in a horizontal direction (XY direction) substantially perpendicular to the extending direction of the pin connection block 220. The lift pin holder 230 may be connected to the pin connection block 220 such that a first sliding portion 232 of the lift pin holder 230 is received movably within a predetermined distance in the horizontal direction (XY direction) within the first guide recess 222.

A second guide recess 224 may be formed in the lower end portion of the pin connection block 220. The first guide recess 222 may be in communication with the second guide recess 224. The second guide recess 224 may extend in the horizontal direction (XY direction) substantially perpendicular to the extending direction of the pin connection block 220. The lift pin holder 230 may be connected to the pin connection block 220 such that a second sliding portion 234 of the lift pin holder 230 is received movably within a predetermined distance in the horizontal direction (XY direction) within the second guide recess 224 while a movement in a vertical direction (Z direction) of the lift pin holder 230 is limited.

Referring to FIGS. 7 to 10, the first guide recess 222 of the pin connection block 220 may extend in the horizontal direction (XY direction) and may have a cylindrical shape, and the first sliding portion 232 of the lift pin holder 230 may have a cylindrical shape corresponding to the first guide recess 222. The first sliding portion 232 may have an outer diameter (D1) of a first size, and the first guide recess 222 may have an inner diameter (D2) of a second size greater than the first size.

When the longitudinal axis C1 of the lift pin 210, that is, the central axis of the pin connection block 220 is arranged coaxially with a longitudinal axis C2 of the lift pin holder 230, the first sliding portion 232 may be spaced apart from an inner surface of the first guide recess 222 by a predetermined first distance L1. Accordingly, the first sliding portion 232 may be movable by the first distance L1 in the horizontal direction (XY direction) within the first guide recess 222.

The first guide recess 222 may have a first open portion 223a opened toward the outside and a first closed portion 223b opposite to the first open portion 223a. The first open portion 223a may have a width (W3) slightly greater than or less than the outer diameter (D1) of the first sliding portion 132, and less than the inner diameter (D2) of the first guide recess 222. Accordingly, the first sliding portion 232 of the lift pin holder 230 may be inserted into in the first guide recess 222 through the first open portion 223a.

The second guide recess 224 of the pin connection block 220 may extend in a direction (for example, Y direction) and may have a plate shape, and the and the second sliding portion 234 of the lift pin holder 230 may have a plate shape corresponding to the second guide recess 224. The second sliding portion 234 may have a width (W1) of a third size, and the second guide recess 224 may have a width (W2) of a fourth size greater than the third size.

The second guide recess 224 may have second open portions 225a in both end portions. Accordingly, the second sliding portion 234 of the lift pin holder 230 may be inserted into the second guide recess 224 through the second open portion 225a.

When the longitudinal axis C1 of the lift pin 210, that is, the central axis of the pin connection block 220 is arranged coaxially with the longitudinal axis C2 of the lift pin holder 230, the second sliding portion 234 may be spaced apart from an inner surface of the second guide recess 224 by a predetermined second distance L2. Accordingly, the second sliding portion 234 may be movable by the second distance L2 in the horizontal direction (XY direction) within the second guide recess 224.

The width (W1) of the second sliding portion 234 may be greater than the inner diameter (D1) of the first guide recess 222. The second guide recess 224 may have a predetermined thickness T, and the second sliding portion 234 may have a thickness tolerance such that the second sliding portion 234 is received within the second guide recess 224 to limit a movement in the vertical direction (Z direction) of the second sliding portion 234. Accordingly, the second sliding portion 234 may be received within the second guide recess 224 to allow a relative movement in the horizontal direction (XY direction) and to limit a relative movement in the vertical direction (Y direction).

A pin receiving recess 236 may be formed in the upper end portion of the lift pin holder 230. The pin receiving recess 236 may be formed in a middle portion of an upper surface of the lift pin holder 230. A central axis of the pin receiving recess 236 may coincide with the longitudinal axis C2 of the lift pin holder 230. The pin receiving recess 236 may have an inner diameter of a sufficient size such that the lower end portion of the lift pin 210 does not contact the lift pin holder 230. For example, when the longitudinal axis C1 of the lift pin 210, that is, the central axis of the pin connection block 220 is arranged coaxially with the longitudinal axis C2 of the lift pin holder 230, an inner surface of the pin receiving recess 236 may be spaced apart from the outer surface of the lift pin 210 by a predetermined distance.

Hereinafter, a self-aligning of the lift pin by the pin connection block will be explained.

Figure 11:
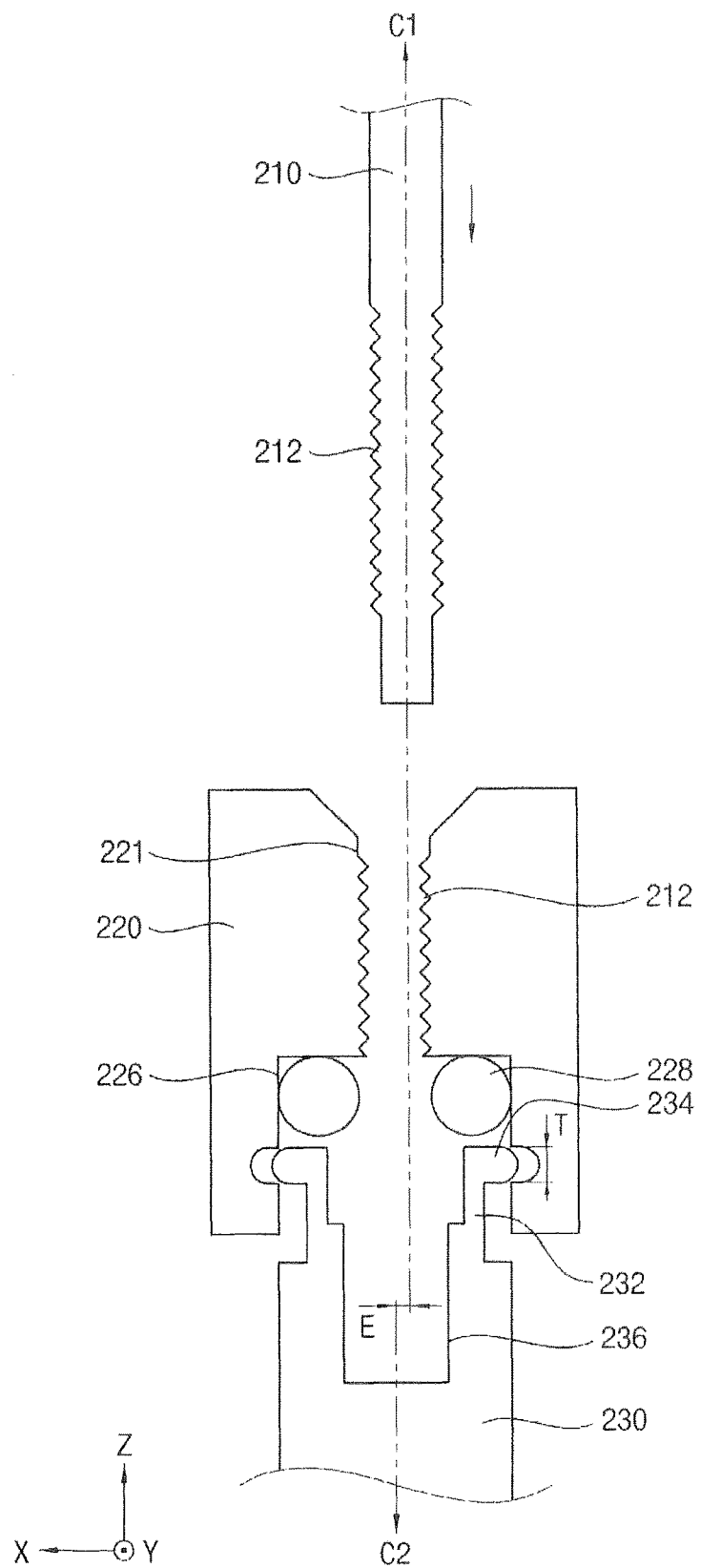
Figure 12:
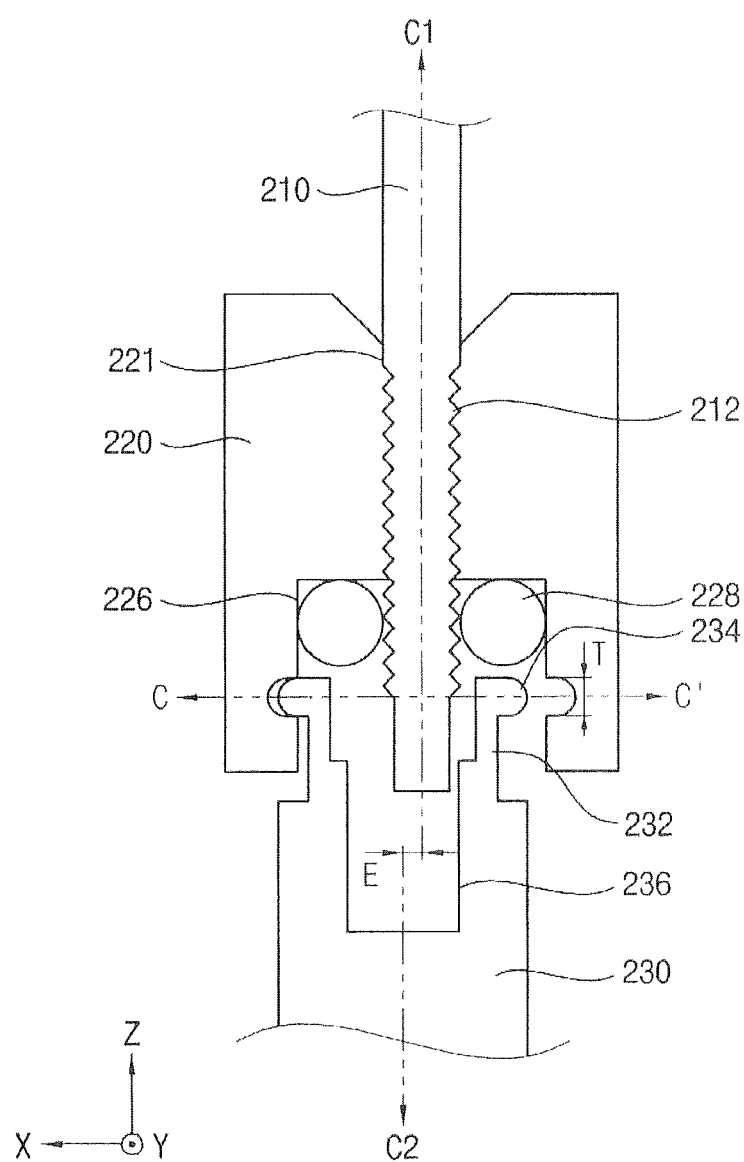
Figure 13:
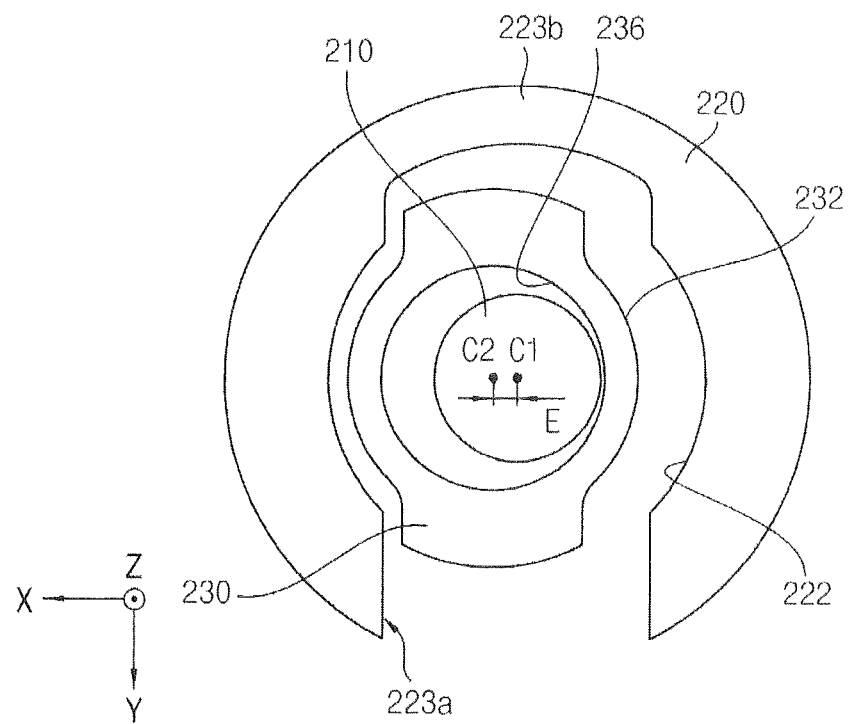
Figure 14:
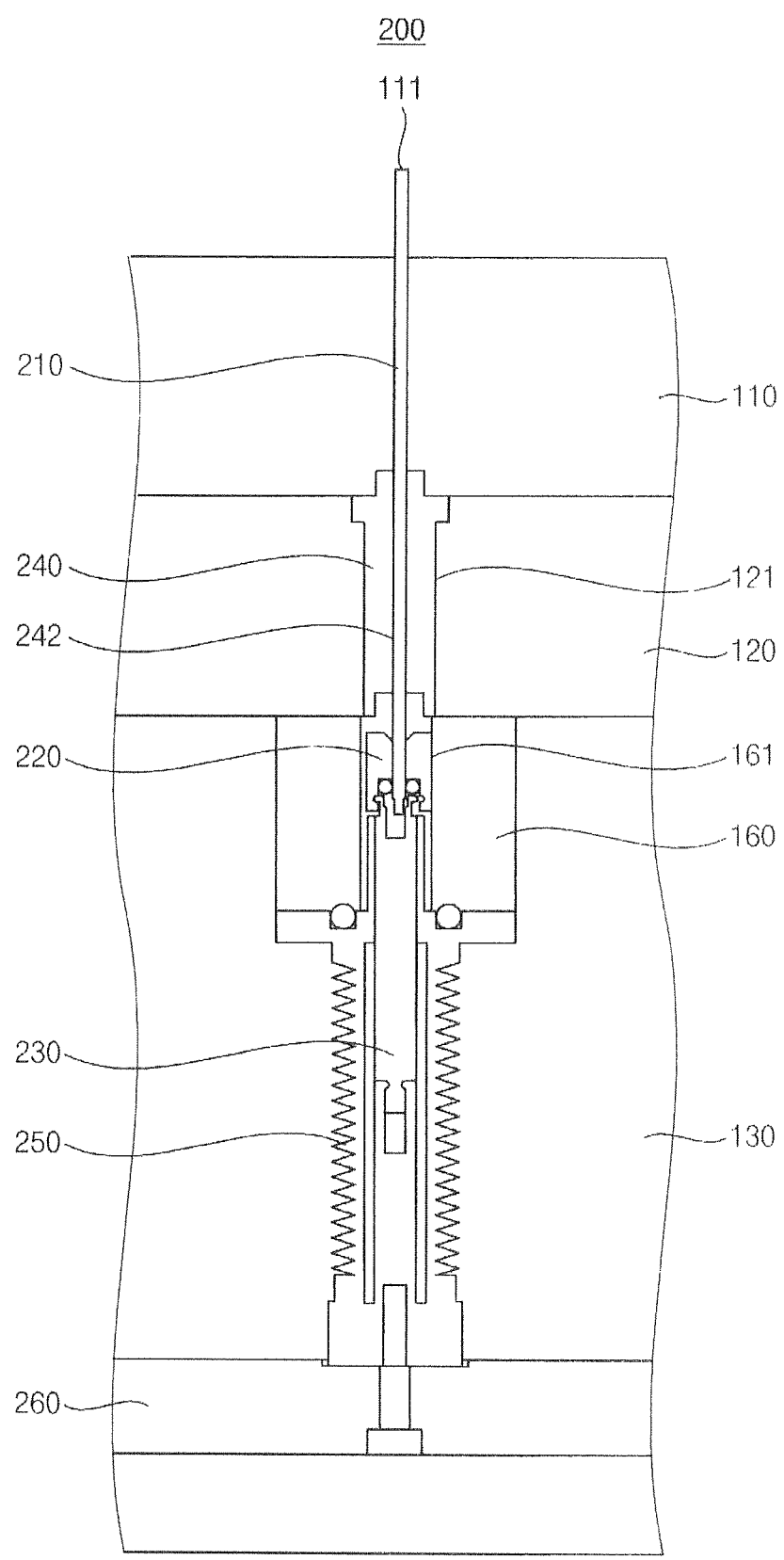

FIG. 11 is a cross-sectional view illustrating alignment of the lift pin with the pin connection block before being assembled with each other. FIG. 12 is a cross-sectional view illustrating the lift pin after being assembled with the pin connection block in FIG. 11. FIG. 13 is a cross-sectional view taken along the line C-C' in FIG. 12. FIG. 14 is a cross-sectional view illustrating the state of the lift pin in FIG. 12 when the lift pin is moved upwardly.

Referring to FIGS. 11 to 14, after the pin connection block 220 and the lift pin holder 230 connected to each other are mounted in the mounting hole of the substrate support unit 100, the lift pin 210 may be combined with the pin connection block 220 through the lift pin hole 111 and the pin guide hole 242. Due to a misalignment between the upper portion of the substrate support unit (the substrate plate 110, the insulation plate 120) and the lower portion of the substrate support unit (the lower cover 130), the lift pin 210 may be inserted into and combined with the pin connection block 220 in a state the longitudinal axis C1 of the lift pin 210 is aligned eccentrically with the longitudinal axis C2 of the lift pin holder 230 by a constant distance. Then, the pin connection block 220 may be moved by a constant distance (E) from the lift pin holder 230 by the eccentrically aligned lift pin 210.

As illustrated in FIGS. 12 and 13, while the lift pin 210 is combined with the pin connection block 220, the pin connection block 220 may be moved in the horizontal direction (for example, X direction) by the eccentricity distance (E) between the longitudinal axes C1, C2 from the lift pin holder 230. The lift pin 210 with the pin connection block 220 may be connected to the lift pin holder 230 where the lift pin 210 is moved in the horizontal direction by the eccentricity distance (E).

As illustrated in FIG. 14, even though the substrate plate 110 and insulation plate 120 are misaligned with the lower cover 130, the lift pin 210 may be moved in a vertical direction to an upper surface of the substrate plate 110 in the state where the lift pin 210 is eccentric in the horizontal direction from the lift pin holder 230. Thus, the lift pin 210 may be prevented from tilting, and therefore, when the lift pin 210 is moved upwardly and downwardly, the lift pin 210 may be prevented from contacting the inner surface of the lift pin hole 111 so that particles are generated or the lift pin 210 is broken.

As mentioned above, the lift pin assembly may include the pin connection block 220 connecting the lift pin 210 and the lift pin holder 230 while allowing a relative movement in the horizontal direction by the eccentricity distance between the lift pin 210 and the lift pin holder 230.

Accordingly, even though a misalignment between the upper part and the lower part of the substrate support unit occurs, the pin connection block 220 may enable the lift pin 210 to move upward and downward in the vertical direction without tilting.

Further, since a relative movement in the vertical direction between the pin connection block 220 and the lift pin holder 230 is limited, the lift pin 210 combined with the pin connection block 220 may be limited so as not to shake up and down in the vertical direction, to thereby prevent wafer sticking.

Hereinafter, a method of manufacturing a semiconductor device using a substrate processing apparatus including the substrate support unit with the lift pin assembly in FIG. 1 installed therein will be explained.

FIG. 15 is a flow chart illustrating a substrate processing method in accordance with example embodiments. The substrate processing method which performs a plasma etching process, may be used for manufacturing a semiconductor device.

Referring to FIGS. 1 and 15, after a wafer is loaded into the chamber 20 (S100), a process gas may be supplied into the chamber 20 (S110).

First, the semiconductor wafer W may be loaded onto the substrate plate 110 of the substrate support unit 100. The process gas (for example, etching gas) may be introduced into the chamber 20 through the gas supply line 50, and the chamber 20 may be depressurized to a desired vacuum level by the exhaust portion.

In example embodiments, when the wafer W is transferred over the substrate plate 110 by a wafer a transfer mechanism (not illustrated), the lift pin driving plate 260 may move upward to raise the lift pin 210 from the upper surface of the substrate plate 110. Then, the wafer W may be transferred on the lift pins 210 by the transfer mechanism, and the lift pin driving plate 260 may move downward to lower the lift pin 210 into the lift pin hole 111 of the substrate plate 110, thereby seating the wafer W on the substrate plate 110.

Then, the electrostatic electrode 112 may apply an electrostatic force on the wafer W on the substrate plate 110, and thus, the wafer W may be adsorptively held on the substrate plate 110 by the electrostatic force.

As a result of the self-aligning function of the lift pin assembly 200, even though a misalignment between the upper part and the lower part of the substrate support unit 100 occurs due to machining and assembly tolerances, distortion due to vacuum formation, etc., the lift pin 210 may move upward and downward in the vertical direction without tilting.

Then, plasma may be generated in the chamber 20 (S120), an etching process may be performed on an object layer on the substrate (S130).

When a plasma source power is applied to the upper electrode 40, an electromagnetic field induced by the upper electrode 40 may be applied to a source gas supplied within the chamber 20 to generate plasma. When a bias power is applied to the lower electrode of the substrate support unit 100, plasma atoms or ion generated within the chamber 20 may be attracted toward the substrate plate 110. Thus, the etching process may be performed on the object layer on the wafer W.

Then, after the etching process is completed, the substrate may be unloaded from the chamber 20 (S140).

In example embodiments, the lift pin driving plate 260 may move downward to raise the lift pin 210 from the substrate plate 110, thereby lifting the wafer W over the substrate plate 110. The transfer mechanism may hold and unload the wafer W from the chamber 20.

The above-mentioned substrate processing apparatus and substrate processing method may be used to manufacture a semiconductor device such as a logic device or a memory device. For example, the semiconductor device may include logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:
1. A lift pin assembly, comprising:
   a lift pin having a first longitudinal axis substantially parallel with a first direction;
   a pin connection block combined with a lower end portion of the lift pin, the pin connection block comprising a first guide recess formed in a side surface of the pin connection block in a lower end portion of the pin connection block, the first guide recess extending in a second direction substantially perpendicular to the first direction, and the side surface of the pin connection block extending in the first direction; and
   a lift pin holder having a second longitudinal axis substantially parallel with the first direction, the lift pin holder comprising a first sliding portion to be received movably in the second direction within the first guide recess by an eccentricity distance of the second longitudinal axis from the first longitudinal axis when the lift pin holder is connected to the lower end portion of the pin connection block.
2. The lift pin assembly of claim 1, wherein when the first longitudinal axis is arranged coaxially with the second longitudinal axis, the first sliding portion is spaced apart from an inner surface of the first guide recess by a predetermined distance.

3. The lift pin assembly of claim 1, wherein the first sliding portion has an outer diameter of a first size, and the first guide recess has an inner diameter of a second size greater than the first size.

4. The lift pin assembly of claim 1, wherein the pin connection block has a third longitudinal axis and the third longitudinal axis coincides with the first longitudinal axis when the lift pin is combined with the pin connection block.

5. The lift pin assembly of claim 1, wherein the pin connection block comprises a fastening hole to receive the lower end portion of the lift pin and to be connected threadedly with the lower end portion of the lift pin.

6. The lift pin assembly of claim 5, further comprising a securing ring for combining with the lower end portion of the lift pin which penetrates through and protrudes from the fastening hole of the pin connection block.

7. The lift pin assembly of claim 1, wherein the pin connection block comprises a second guide recess in communication with the first guide recess and extending in the second direction, and wherein the lift pin holder comprises a second sliding portion to be received movably in the second direction within the second guide recess while a movement of the second sliding portion in the first direction is limited.

8. The lift pin assembly of claim 7, wherein when the first longitudinal axis is arranged coaxially with the second longitudinal axis, the second sliding portion is spaced apart from an inner surface of the second guide recess by a predetermined distance.

9. The lift pin assembly of claim 7, wherein the second sliding portion has an outer diameter of a third size, and wherein the second guide recess has an outer diameter of a fourth size greater than the third size.

10. The lift pin assembly of claim 9, wherein the outer diameter of the second sliding portion is greater than the first guide recess.

11. A lift pin assembly, comprising:
a lift pin having a first longitudinal axis substantially parallel with a first direction;
a pin connection block combined with a lower end portion of the lift pin, the pin connection block comprising a first guide recess and a second guide recess formed in a side surface of the pin connection block in a lower end portion of the pin connection block, wherein the first guide recess and the second guide recess are in communication with each other and extend in a second direction substantially perpendicular to the first direction respectively, and wherein the side surface of the pin connection block extends in the first direction
a lift pin holder having a second longitudinal axis substantially parallel with the first direction, the lift pin holder comprising a first sliding portion to be received movably in the second direction within the first guide recess by an eccentricity distance of the second longitudinal axis from the first longitudinal axis when the lift pin holder is connected to the lower end portion of the pin connection block and a second sliding portion to be received movably in the second direction within the second guide recess while a movement of the second sliding portion in the first direction is limited.

12. The lift pin assembly of claim 11, wherein when the first longitudinal axis is arranged coaxially with the second longitudinal axis, the first sliding portion is spaced apart from an inner surface of the first guide recess by a first distance and the second sliding portion is spaced apart from an inner surface of the second guide recess by at least the first distance.

13. The lift pin assembly of claim 11, wherein the first sliding portion has an outer diameter of a first size, the first guide recess has an inner diameter of a second size greater than the first size, the second sliding portion has an outer diameter of a third size, and the second guide recess has an outer diameter of a fourth size greater than the third size.

14. The lift pin assembly of claim 11, wherein the pin connection block comprises a fastening hole to receive the lower end portion of the lift pin and to be connected threadedly with the lower end portion of the lift pin.

15. The lift pin assembly of claim 11, wherein the first and second guide recesses have first and second open portions through which the first and second sliding portions are inserted, respectively.

16. A lift pin assembly, comprising;
a lift pin having a first longitudinal axis substantially parallel with a first direction;
a lift pin holder having a second longitudinal axis; and
a pin connection block combined with a lower end portion of the lift pin and connected to an upper end portion of the lift pin holder such that the lift pin is movable in a horizontal direction with respect to the lift pin holder by an eccentricity distance of the first longitudinal axis from the second longitudinal axis,
wherein the pin connection block comprises a first guide recess formed in a side surface of the pin connection block, the side surface of the pin connection block extending in the first direction, and
wherein the lift pin holder comprises a first sliding portion to be received within the first guide recess.

17. The lift pin assembly of claim 16, wherein the first guide recess is formed in a lower end portion of the pin connection block and extends in a direction substantially perpendicular to an extending direction of the pin connection block, and the first sliding portion is movable in the horizontal direction with respect to the lift pin holder within the first guide recess when the lift pin holder is connected to the lower end portion of the pin connection block.

18. The lift pin assembly of claim 17, wherein the first sliding portion has an outer diameter of a first size, and wherein the first guide recess has an inner diameter of a second size greater than the first size.

19. The lift pin assembly of claim 17, wherein the pin connection block comprises a second guide recess in communication with the first guide recess that extends in the direction substantially perpendicular to the extending direction of the pin connection block, and the lift pin holder comprises a second sliding portion to be received movably in the horizontal direction with respect to the lift pin holder within the second guide recess while a movement of the second sliding portion in the extending direction of the pin connection block is limited.

20. The lift pin assembly of claim 19, wherein the second sliding portion has an outer diameter of a third size, and wherein the second guide recess has an outer diameter of a fourth size greater than the third size.

* * * * *